(12) United States Patent
Tietjen et al.

(10) Patent No.: US 8,836,552 B1
(45) Date of Patent: Sep. 16, 2014

(54) DIRECT INPUT RADIO FREQUENCY COMPLEX ANALOG TO DIGITAL CONVERTER WITH CORRECTIVE FACTORS

(71) Applicant: Lockheed Martin Corporation, Bethesda, MD (US)

(72) Inventors: Byron W. Tietjen, Baldwinsville, NY (US); Lindsay C. Peterson, Baldwinsville, NY (US); Michael J. Walsh, Baldwinsville, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/832,256

(22) Filed: Mar. 15, 2013

(51) Int. Cl.
*H03M 1/06* (2006.01)

(52) U.S. Cl.
USPC .......................................... 341/118; 341/155

(58) Field of Classification Search
CPC ..... H03M 1/1215; H03M 1/121; H03M 1/06; H03M 1/0607; H03M 1/1042; H03M 1/1052
USPC ................................................. 341/118, 155
See application file for complete search history.

(56) References Cited

U.S. PATENT DOCUMENTS

| | | | |
|---|---|---|---|
| 4,312,073 A | 1/1982 | de Niet et al. | |
| 7,532,684 B2 | 5/2009 | Tietjen | |
| 7,541,952 B1* | 6/2009 | Sankaran et al. | 341/118 |
| 7,675,441 B2* | 3/2010 | Sheng et al. | 341/120 |
| 7,692,570 B2 | 4/2010 | Martellock et al. | |
| 7,705,761 B2 | 4/2010 | Tietjen et al. | |
| 7,768,437 B2 | 8/2010 | Annampedu et al. | |
| 8,193,956 B2* | 6/2012 | Messier | 341/118 |
| 8,279,100 B2 | 10/2012 | Caci et al. | |
| 8,558,725 B2* | 10/2013 | Kidambi | 341/118 |

* cited by examiner

*Primary Examiner* — Khai M Nguyen
(74) *Attorney, Agent, or Firm* — Howard IP Law Group, PC

(57) ABSTRACT

A direct radio frequency complex analog to digital converter (CADC) device provides corrective factors including a plurality of time-interleaved low speed ADCs, wherein each ADC corresponds to an ADC channel. A phase corrective factor is calculated for each ADC channel. An amplitude corrective factor is calculated for each ADC channel. The phase and amplitude corrective factors are applied to complex bandpass filter coefficients to produce filter coefficients corrected for the phase and amplitude imbalances between ADCs. Digital output of each ADC channel is filtered by a complex bandpass filter using the corrected filter coefficients to produce corrected in-phase and quadrature output at baseband. Harmonics produced by the ADCs are canceled by filtering ADC outputs in a first bandpass filter to an intermediate frequency such that the harmonics fall outside the band of interest, a second filter is applied to attenuate the harmonic and produce a signal output at baseband.

29 Claims, 10 Drawing Sheets

DIRECT INPUT RADIO FREQUENCY COMPLEX ANALOG TO DIGITAL CONVERTER WITH CORRECTIVE FACTORS

FIELD OF THE INVENTION

This disclosure relates to analog to digital conversion of radio frequency (RF) signals.

BACKGROUND

Radio frequency (RF) signals are propagated through the air in an analog format. To realize the benefits that digital processing of the signal provides, the analog RF signal must be converted into a digital format. Analog to digital converters (ADCs) periodically sample the analog RF signal and output a digital signal containing the periodic samples which are representative of the original analog RF signal. Complex analog to digital converters (CADCs) receive an analog RF signal as an input and output an in-phase (I) digital output and a quadrature (Q) digital output A complex analog to digital converter (CADC) is described in U.S. Pat. No. 7,532,684, issued May 12, 2009, to Tietjen which is herein incorporated by reference. The CADC receives an RF input signal and outputs in-phase and quadrature digital signal outputs at baseband. The CADC includes a rate reduction system, which is comprised of a number, N, of low speed ADCs. The output of each ADC is coupled to an in-phase multiplier and a quadrature multiplier. The in-phase and quadrature multipliers are, in turn, coupled to an in-phase and quadrature summer, respectively. The complex multipliers and summers define a complex bandpass filter. The digital outputs of the ADCs are multiplied by complex filter weights and summed to convert the input RF signal to baseband using aliasing to shift the band of interest (BOI) to baseband.

More particularly, the prior art CADC described in U.S. Pat. No. 7,532,684 operates using a carrier frequency $f_o$ of the RF signal is typically in the Gigahertz (GHz) range. The input RF signal may be an X-band system having a carrier frequency of approximately 9.0 GHz, for example. The RF signal further has a signal bandwidth (BW). The RF signal is sampled at an initial effective sampling rate $f_s$, that is equal to an integer multiple of $f_o$. A clock phase circuit provides a clock signal to each of the N ADCs, the clock signal being time interleaved with respect to the other ADCs. The clock signals to each ADC are delayed and cause the N ADCs to sequentially sample the RF signal and output a digital sample which when taken together, represent the RF waveform sampled at the effective sampling rate. Because the N phase clock signals each sample the RF signal at a rate equal to $f_s/N$, relatively low speed ADCs may be used. This simplifies the circuit design and allows for the use of ADCs having a larger bit word size than comparable higher speed ADCs. A complex digital bandpass filter is implemented through weighting and summing the ADC outputs to produce digital I and Q outputs at baseband.

However, imperfections in the ADCs (e.g. hardware tolerances and/or manufacturing limitations) cause the measured results to fall short of expected results. Amplitude and phase imbalances between the various ADC channels along with clock skew errors result in a distorted filter response, which in turn, reduces suppression of the negative frequency image from its expected value. Furthermore, ADC hardware introduces harmonics which may reduce the spurious free dynamic range (SFDR) to a level that is insufficient for certain high-end applications such as radar and communications. Alternative techniques and systems are desired.

SUMMARY

According to an embodiment, a CADC is provided which utilizes corrective factors to account for amplitude and phase imbalances, in addition to canceling harmonics. A direct radio frequency complex analog to digital converter (CADC) device that provides corrective factors includes a plurality of time-interleaved low speed ADCs, wherein each ADC corresponds to an ADC channel. A phase corrective factor and an amplitude corrective factor is calculated for each ADC channel. The phase and amplitude corrective factors are applied to complex bandpass filter coefficients to produce filter coefficients corrected for the phase and amplitude imbalances between ADCs. Digital output of each ADC channel is filtered by a complex bandpass filter using the corrected filter coefficients to produce corrected in-phase and quadrature output at baseband. Harmonics produced by the ADCs are canceled by filtering ADC outputs in a first bandpass filter to an intermediate frequency bandwidth such that the harmonics fall outside the band of interest. A second filter is applied to attenuate the harmonics and produce a signal output at baseband.

A method of correcting digital output of a plurality of time-interleaved ADCs, each ADC corresponding to an ADC channel, in a direct RF CADC includes receiving an RF input signal at a given frequency. For each ADC channel, a phase corrective factor is calculated. An amplitude corrective factor is calculated for each ADC channel based on imbalances between the ADCs. The phase and amplitude corrective factors are applied to filter coefficients corresponding to an ADC channel. The digital sample output of each ADC channel is filtered using a complex bandpass filter, the filter using the corrected filter coefficients. The filter produces corrected in-phase and quadrature outputs at baseband.

DETAILED DESCRIPTION

The following description describes devices and methods for determining and applying correction factors in a complex analog to digital converter. The functions described herein may be performed by a computer having a processor. The processor may be in communication with a memory storing machine-readable instructions. The instructions, when executed by the processor, cause the processor to perform the steps of determining and applying the correction factors. It should be appreciated that the described functions may be performed in hardware, software, firmware or a combination of any of these.

Figure 1:
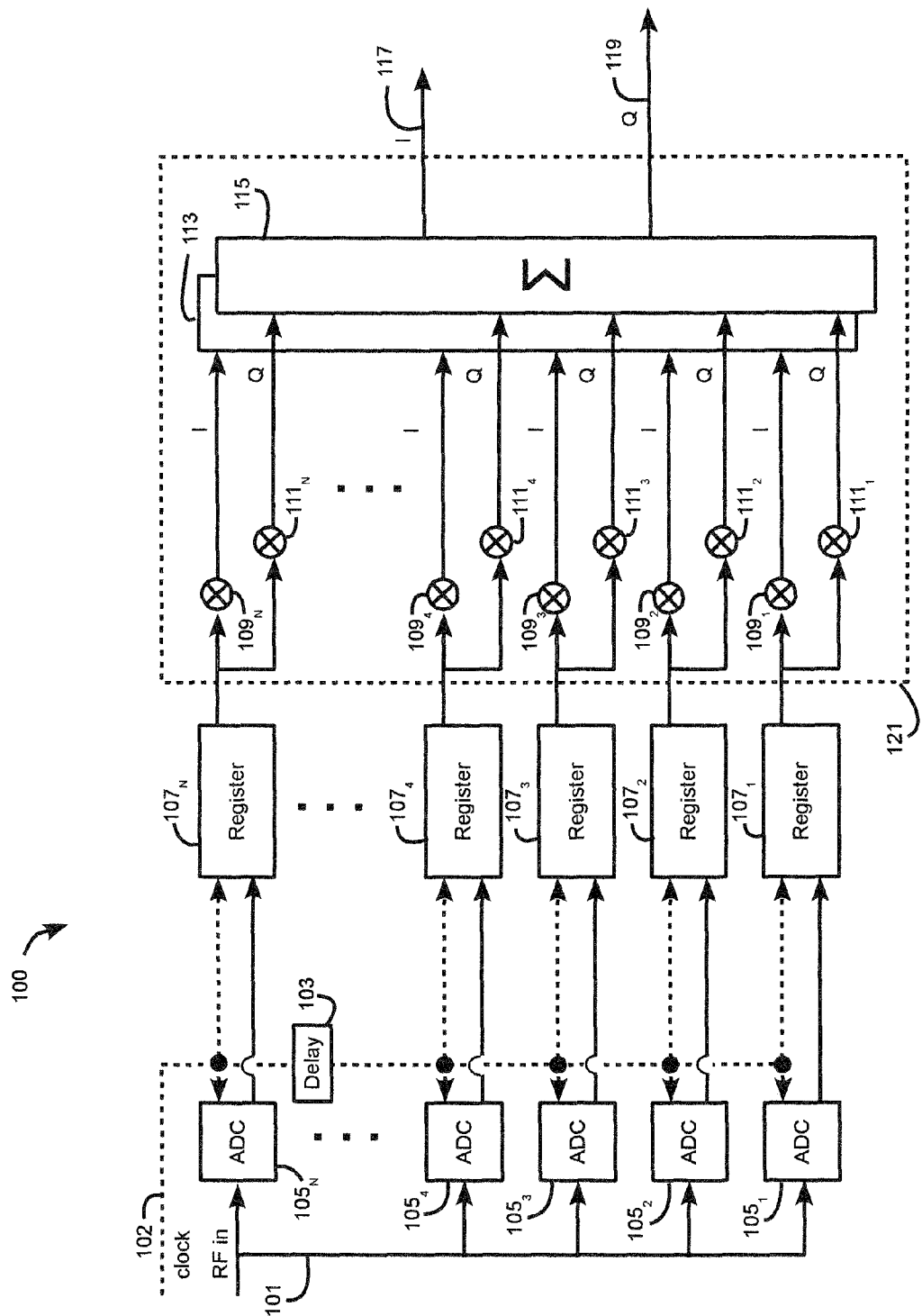
FIG. 1 is a block diagram of a complex analog to digital converter.

FIG. 1 is a block diagram of a direct RF CADC 100. The CADC 100 includes a rate reduction system comprising a number, N, of relatively low speed ADCs compared to ADCs conventionally used to sample high frequency RF input signals. The lower speed ADCs are denoted generally as 105. An input RF signal 101 is received and input to each ADC 105. A system clock signal 102 is provided to each ADC 105 via clock delay circuit 103. The clock signals provided to each ADC 105 are time interleaved with respect to each ADC 105 such that the ADCs $105_1$-$105_N$ sequentially sample the RF input signal 101 at an effective sampling rate corresponding to the number of ADCs 105 used. The output of all ADCs 105 taken together represent the RF input signal 101 sampled at the effective sampling rate. Each ADC $105_1$-$105_N$ is coupled to a corresponding register $107_1$-$107_N$ which stores the digital output from the ADC. Each register 107 is coupled to an in-phase multiplier $109_1$-$109_N$ and a quadrature multiplier $111_1$-$111_N$. The digital outputs of the ADCs 105 are multiplied by a complex filter weight and summed. The in-phase multipliers 109 are coupled to summer 113. The quadrature multipliers 111 are coupled to summer 115. A complex bandpass filter 121 is defined by weighting and summing the ADC 105 outputs to provide I and Q outputs 117 and 119, respectively.

Figure 2:
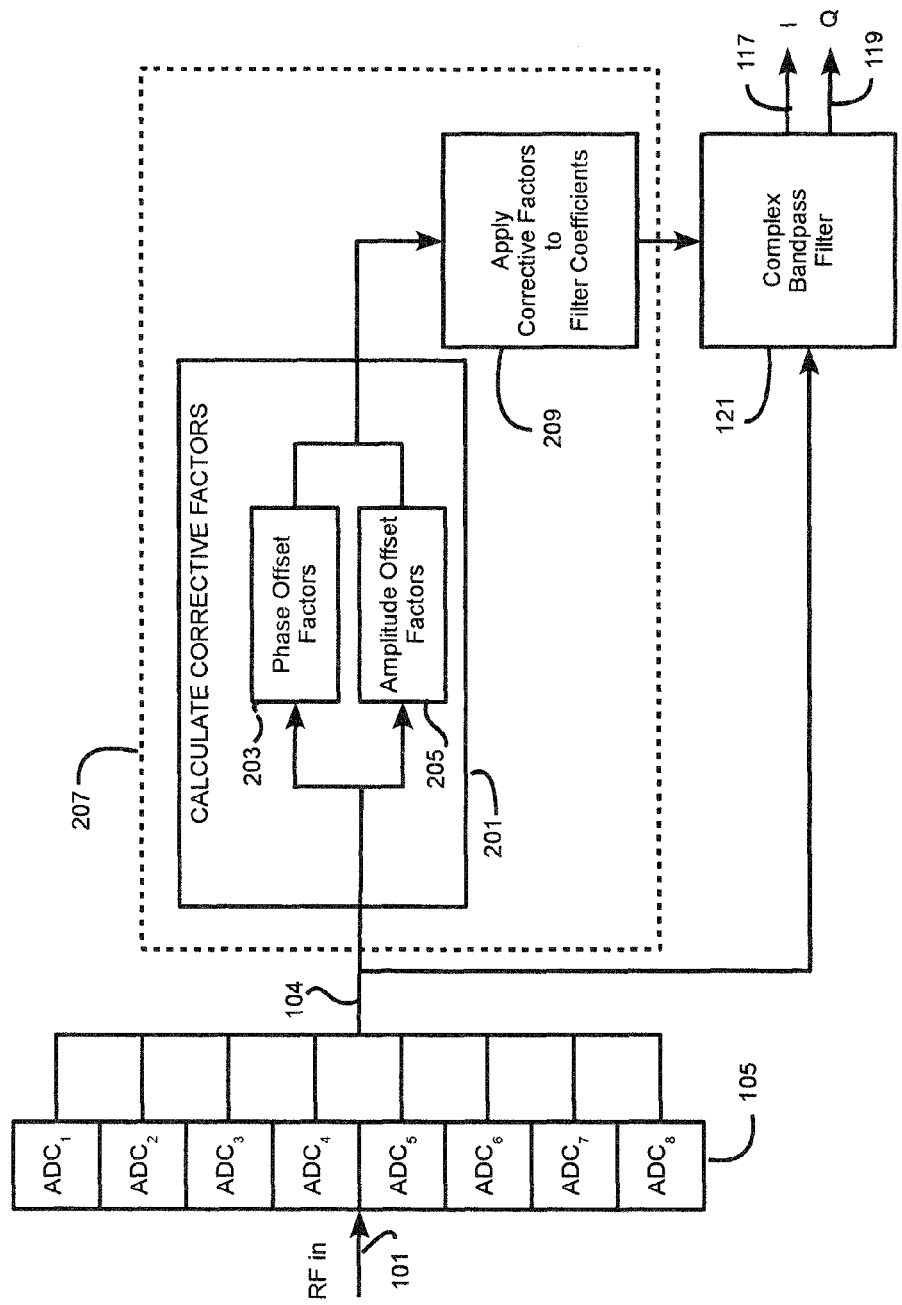
FIG. 2 is a block diagram of a CADC having corrective factors for amplitude and phase according to an exemplary embodiment.

FIG. 2 is a block diagram of a complex analog to digital converter with corrective factors applied to the complex bandpass filter according to an embodiment of the invention. As described hereinabove with regard to FIG. 1, an RF input signal 101 is received at a plurality of relatively low speed ADCs 105. The ADCs 105 are time interleaved with each ADC 105 receiving a clock signal that is either delayed or advanced compared to the other ADCs 105. In general, the digital outputs of the ADCs 105 are input to signal processing 207 which determines and applies corrective factors to the weights of the complex bandpass filter 121. While it is noted that the ADC 105 outputs are shown being input to a single instance of signal processing 207, it should be understood that signal processing 207 may be implemented at each ADC channel, providing an instance of signal processing 207 for each ADC 105. The ADC outputs 104 are further input directly into the complex bandpass filter 121 to provide the digital in-phase output 117 and digital quadrature output 119 at baseband. Influences such as manufacturing variances between ADCs 105 can lead to imbalances in phase and amplitude of the digital ADC outputs 104. In order to compensate, the ADC digital outputs 104 are processed to determine a set of filter corrective factors (201) to be applied to the filter coefficients of complex bandpass filter 121. More particularly, the system determines phase offset factors 203 based on the ADC output 104. The phase offset factors 203 are applied to the filter coefficients 209 of complex bandpass filter 121 to adjust the response of complex bandpass filter 121 to compensate for the phase imbalances. The digital outputs 104 from ADCs 105 are further analyzed for amplitude offset factors 205. The amplitude offset factors 205 are applied to the filter coefficients 209 of complex bandpass filter 121 to adjust the output of complex bandpass filter 121 to compensate for amplitude imbalances between the ADCs 105.

Thus, the corrective phase and amplitude offset factors are applied to the complex weighting coefficients of complex bandpass filter 121 in block 209. The updated weighting coefficients are used by the in-phase and quadrature multipliers depicted and described in FIG. 1. When the correction factors for phase and amplitude are applied to the weighting coefficients of the complex bandpass filter 121, the filter response produces an output that is more consistent with expected results. The inconsistencies produced by inevitable hardware imbalances between the ADCs are detected and accounted for by the corrected filter weights.

In order to determine the corrective factors, embodiments of the invention utilize the fact that the clock signal from one ADC 105 to the next is delayed, so that a phase difference exists between the digital outputs of the ADCs 105. Thus, if a calibration signal of a known frequency is input to the CADC 100, the expected phase difference between ADCs 105 is known, assuming perfect clock delays and channel phase balance. The expected phase differences may be determined and stored in a memory for retrieval during the phase correction process and compared to actual measured phase differences to compute the phase corrective factors.

According to an embodiment of the invention, a phase correction algorithm analyzes actual digital outputs from each of the ADCs 105 and processes each ADC channel with a fast Fourier transform (FFT) in order to extract the frequency component(s) corresponding to the known calibration signal. Since the calibration frequency is known, it is not necessary to use an FFT which computes all frequency components, but rather, a single discrete Fourier transform (DFT) channel may be computed to extract the measured phase of the digital outputs from the ADCs 105.

Figure 3A:
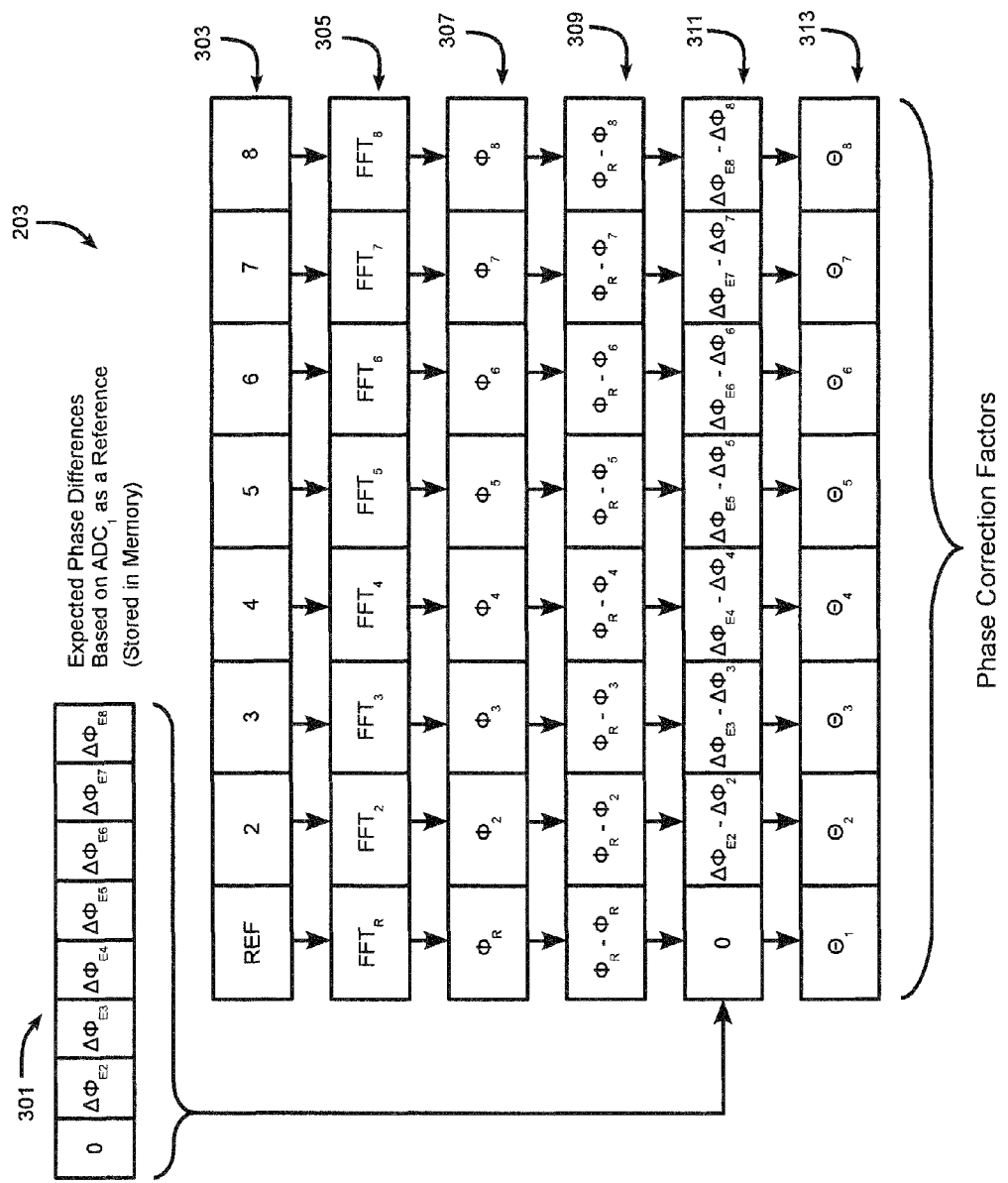
FIG. 3A is a block diagram useful for illustrating the calculation of phase correction factors for application in each of the ADCs according to an embodiment of the invention.

Referring to FIG. 3A in conjunction with FIGS. 1 and 2, block 301 shows an expected phase difference corresponding to each ADC. The eight partitions of block 301 correspond to each of the 8 ADCs depicted in FIG. 2 as 105. The expected phase difference ($\Delta\phi_E$) 301 is computed for each ADC 105 channel based on a known calibration signal frequency and clock delay. One of the ADCs is selected to provide a baseline reference phase offset. In FIG. 3A, this is shown as $ADC_1$, which is indicated by a phase delta of zero. Each of the other phase differences are with respect to the baseline reference phase and an associated clock delay. While FIG. 3A is described using $ADC_1$ as a baseline phase reference, this is by way of non-limiting example only and any of the ADCs 105 may be used as the baseline phase reference. The expected phase differences are determined and stored in a memory where they can be recalled as part of the phase correction process.

Block 303 represents the eight ADCs 105 (FIG. 2) and are numbered REF, 2-8 to indicate the corresponding ADC 1-8. The first $ADC_1$ is selected as the baseline reference phase as indicated by the "REF" designation. Each ADC 303 produces an output stream of digital samples which are passed to a fast Fourier transform (FFT) process 305. Each ADC channel includes an FFT processor for performing the FFT process on the digital output of the ADC. The FFT processor decomposes the digital output into its frequency components, including frequency components corresponding to the known calibration signal frequency.

Each FFT 305 extracts frequency component(s) corresponding to the calibration signal. The measured phase of the received calibration signal is determined for each ADC channel. The measured actual phase 307 includes the effects of any phase imbalances that exist between a given ADC channel and the other ADC channels.

The measured phase difference for each ADC channel 309 is then calculated by taking the baseline reference phase (in the example of FIG. 3A, the phase at $ADC_1$) and subtracting the measured actual phase 307 for each ADC channel. The phase differences of the ADC channels represent the imbalances present in the ADC channel relative to the reference ADC channel based on the actual received RF signal including the calibration frequency.

The detected phase differences for each ADC channel 309 are then subtracted from the expected phase differences 301 for each corresponding ADC channel 311. The difference between the expected phase difference 301 and the measured phase difference 309 represents the phase imbalances of that particular ADC channel. The result of the measured difference 309 is the phase corrective factor 313 for the ADC channel. The corrective factor 313 is then applied to the complex bandpass filter coefficients for the corresponding ADC channel to compensate for the phase imbalances in that ADC.

Figure 3B:
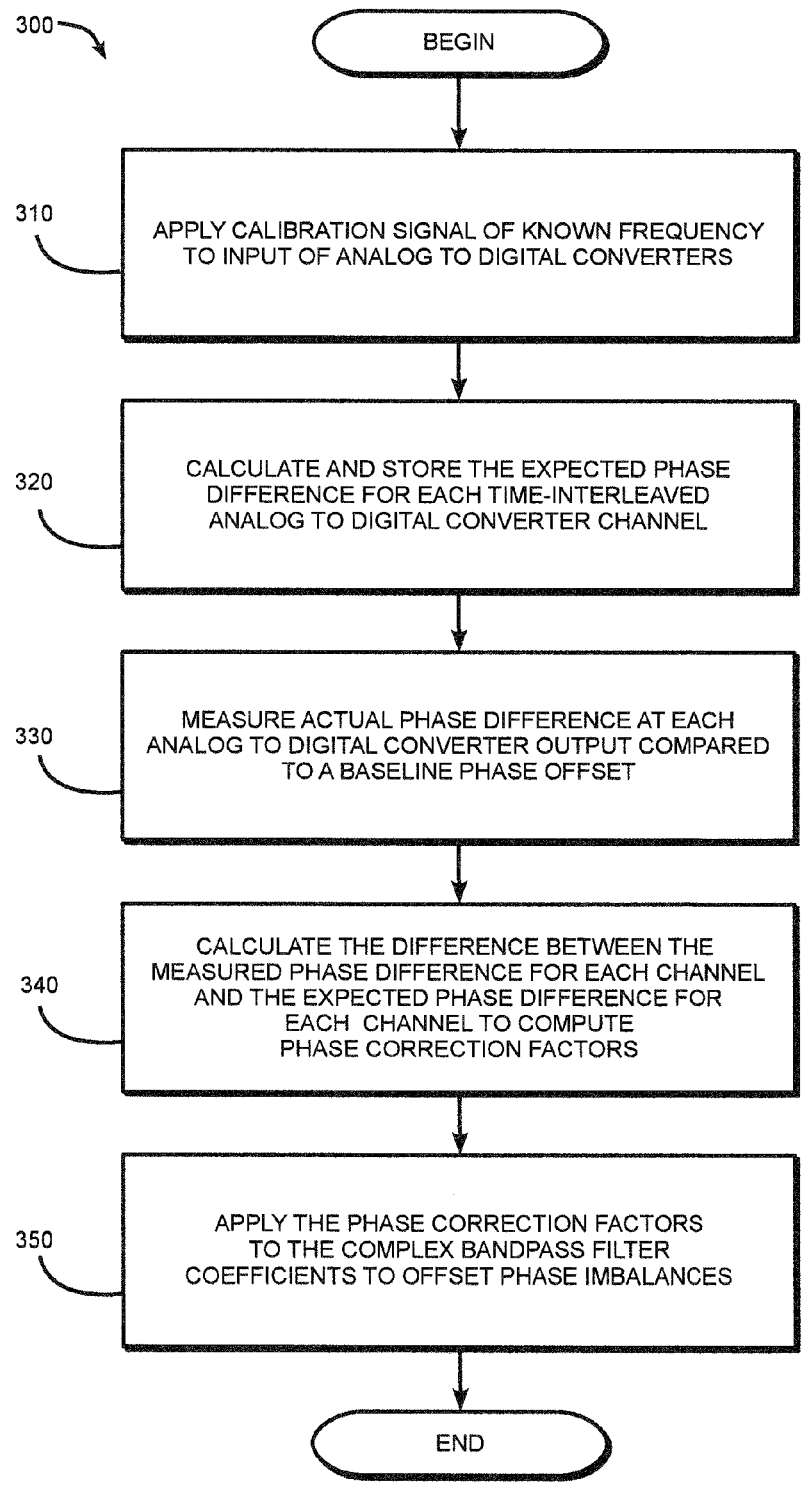
FIG. 3B is a flow diagram illustrating the phase error correction process in a CADC according to an embodiment of the invention.

FIG. 3B is flow diagram illustrating the phase error correction process 300 in a CADC according to an embodiment of the invention. At block 310, a calibration signal having a known frequency is applied at the input to the CADC. Based on the known calibration frequency and the clock delay applied to each ADC, an expected phase offset for each ADC channel may be calculated. The expected phase offset is calculated for each ADC channel and stored in memory for later use at block 320.

At each ADC channel, the phase of the digital output samples of each ADC are measured. An arbitrary ADC is selected as a baseline phase reference to which the other ADC outputs will be compared. The actual phase of each ADC channel is measured and compared to the baseline phase reference to determine a measured actual phase difference for each ADC channel with respect to the baseline reference phase at block 330. The measured actual phase difference for each ADC channel is then subtracted from the stored expected phase difference corresponding to the ADC channel to compute a phase correction factor for the ADC channel at block 340.

The computed phase correction factors for each ADC channel are applied to the complex filter weights associated with the corresponding ADC channel to offset the phase imbalances detected in the ADC channel at block 350.

Figure 4A:
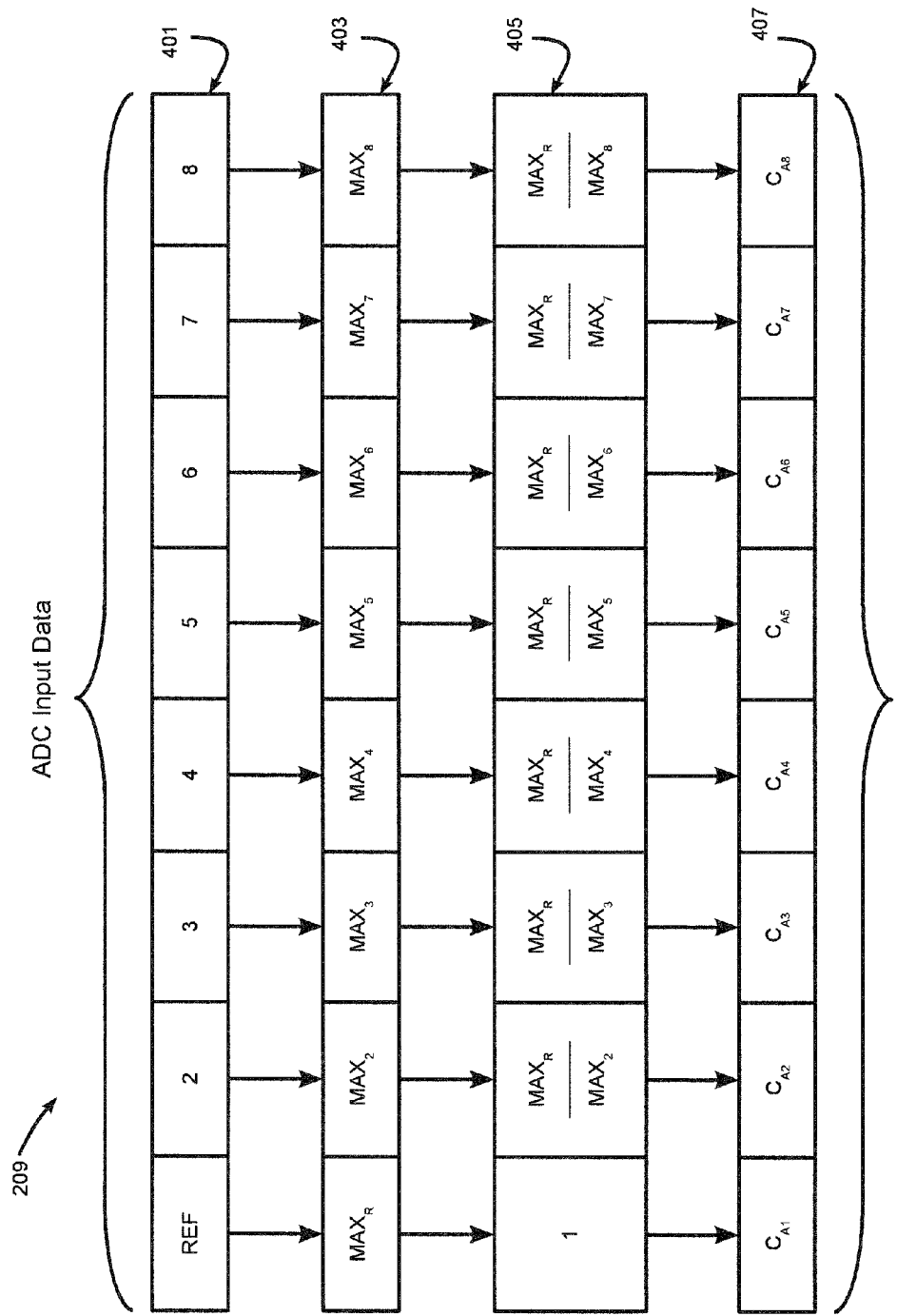
FIG. 4A is a block diagram useful in illustrating the calculation of amplitude correction factors in a CADC according to an embodiment of the invention.

FIG. 4A is a block diagram useful in illustrating the calculation of amplitude correction factors 205 in a CADC. At block 401, each segment REF—8 represents each of the eight ADC channels. The first ADC, which by way of example in FIG. 4A is $ADC_1$, is selected as a baseline reference amplitude and denoted "REF". Each of the other ADC channels (2-8) will be compared to the baseline reference to determine the amplitude corrective factor for that ADC channel. Each of the ADCs digital output samples representative of the input RF signal are provided to a processor that determines a maximum amplitude for the digital samples. The maximum amplitude is determined for each ADC channel at block 403. A ratio of the baseline reference amplitude, $MAX_R$, and the measured maximum amplitude for the ADC channel is then calculated 405. As shown, the ADC channel selected as the baseline amplitude reference (i.e. $ADC_1$) will, therefore, have a ratio of one. The ratio computed for each other ADC channel will produce an amplitude corrective factor 407 for the corresponding ADC channel. The amplitude correction factor 407 for the ADC channel is then applied to the complex filter weight coefficients for the associated ADC channel in the complex bandpass filter 121 (FIG. 2). The amplitude corrective factors compensate for the amplitude imbalances measured at each ADC channel and improve the filter response of the complex bandpass filter 121.

Figure 4B:
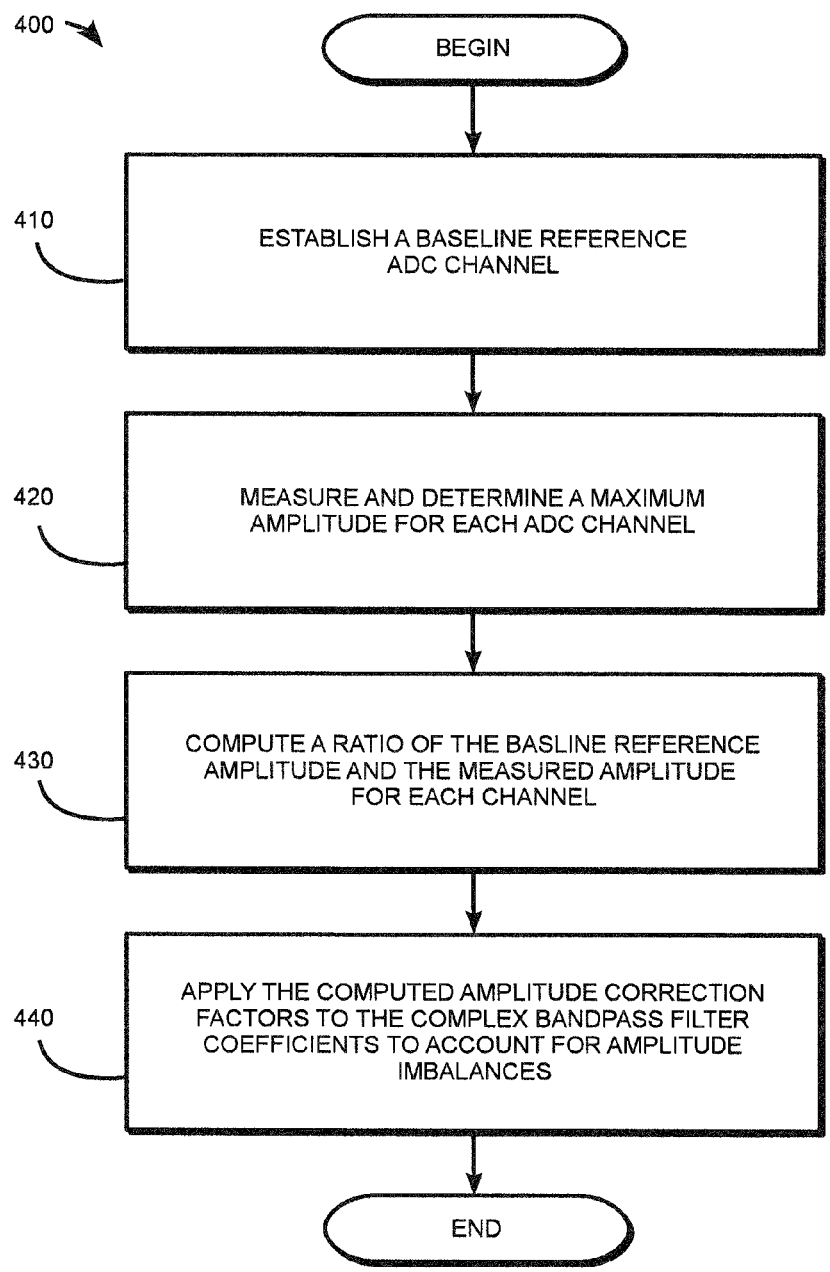
FIG. 4B is a flow diagram illustrating the amplitude error correction process in a CADC according to an embodiment of the invention.

FIG. 4B is a flow diagram illustrating the amplitude error correction process 400 in a CADC according to an embodiment of the invention. An arbitrary ADC channel of the CADC is selected to establish a baseline reference amplitude at block 410. At each ADC channel, digital sample output from each ADC are measured. A maximum amplitude for each set of digital samples at each ADC channel is determined at block 420. A ratio is calculated of the baseline reference amplitude and the actual measured maximum amplitude of the corresponding ADC channel at block 430 to produce an amplitude corrective factor for the corresponding ADC channel. The amplitude corrective factor for each ADC channel is applied to the complex filter weights corresponding to the ADC channel in the complex bandpass filter at block 440. The application of the amplitude corrective factors to the complex filter coefficients compensate for the measured amplitude imbalances of the ADC channel to produce a complex bandpass filter response that accounts for amplitude imbalances introduced by the ADC hardware.

The phase correction factors calculated in FIG. 3A and FIG. 3B in combination with the amplitude correction factors calculated in FIG. 4A and FIG. 4B allow the complex digital bandpass filter to adaptively tune out the phase and amplitude imbalances present across the analog hardware and ADCs of the CADC system.

The phase corrective factors 313 and the amplitude corrective factors 407 are applied to the original complex filter coefficients ($h_n$) to provide complex bandpass filter correction.

For each amplitude offset factor, the corresponding original filter coefficient is directly multiplied by its corresponding amplitude correction factor ($C_{An}$). Each phase offset factor, each corresponding filter coefficient is multiplied by a correction factor derived from its corresponding phase corrective factor (in radians) according to:

$$e^{j\Theta_n} \quad \text{Equation (1)}$$

Accordingly, the corrected filter coefficients adjusted for amplitude and phase may be derived according to:

$$\text{Corrected } h_n = h_n(C_{An})(e^{j\Theta_n}) \quad \text{Equation (2)}$$

where n is the corresponding ADC channel.

Figure 5:
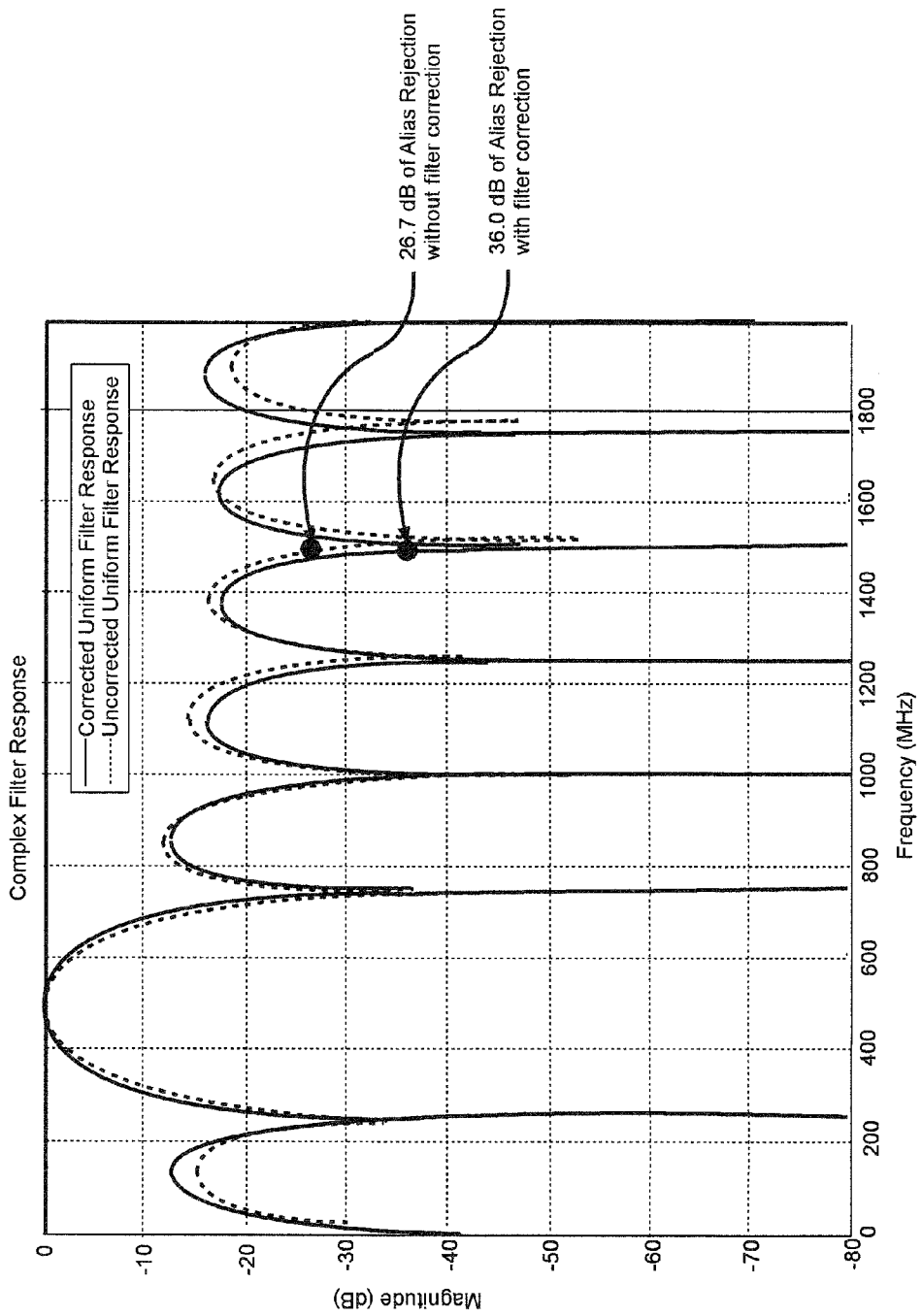
FIG. 5 is a graphical representation of a complex filter response as a function of frequency illustrating alias rejection with and without complex bandpass filter correction.

FIG. 5 is a graphical representation of a complex filter response as a function of frequency illustrating alias rejection with and without complex bandpass filter correction. The alias rejection at the frequency of interest for the corrected filter response is −36.0 dB versus only −26.7 dB of alias rejection for the non-corrected filter for a test input frequency of 510 MHz aliasing at 1500 MHz.

Figure 6:
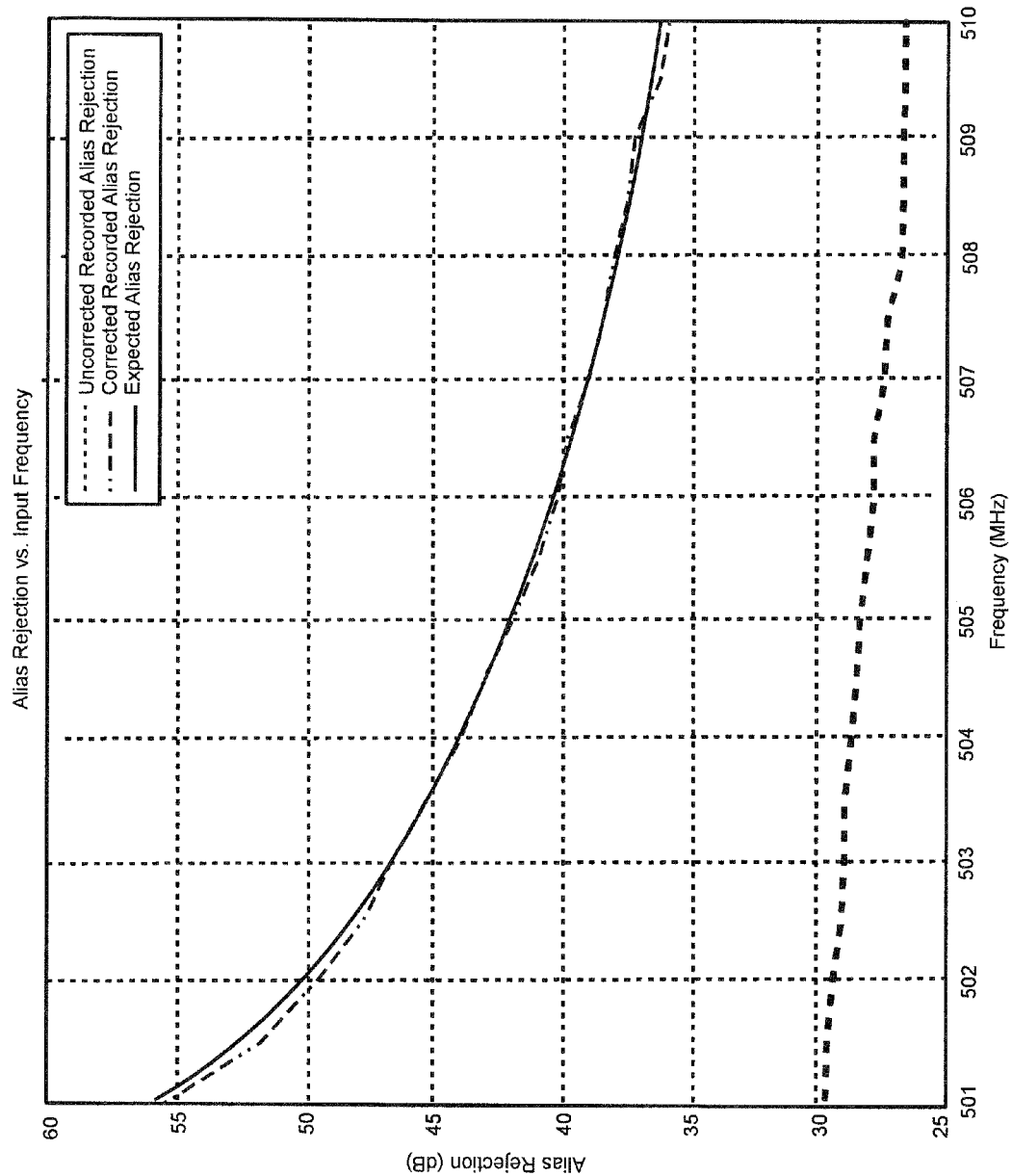
FIG. 6 is a graphical representation of alias rejection vs. frequency for a corrected and uncorrected complex bandpass filter with reference to a curve of expected alias rejection according to an embodiment.

FIG. 6 is a graphical representation of alias rejection vs. frequency for a corrected and uncorrected complex bandpass filter with reference to a curve of expected alias rejection according to an embodiment. As may be seen, the corrected filter provides alias rejection which closely follows the expected alias rejection curve over the frequency range.

In addition to the performance degradation caused by the phase and amplitude imbalances in the ADC channels, the ADCs further produce harmonics which act to reduce the spurious free dynamic range of the CADC architecture. The fact that harmonics occur at predictable frequencies may be exploited to compensate for the harmonics introduced by the ADCs. To do this, a frequency plan may be implemented where the clock rate of the CADC is chosen to reduce the RF band of interest (BOI) to a low intermediate frequency (IF) band where the lowest IF frequency is greater than the bandwidth of the signal of interest. In this way, the low-order harmonics of the signal fall outside the BOI. A second stage complex bandpass filter may be configured to have a pass band centered at the band of interest and be further configured to have nulls centered at the expected harmonic frequencies. The second stage complex bandpass filter is applied to the IF signal to down sample and output the signal at baseband. This improves not only the SFDR, but also results in improved image suppression and signal to noise ratio (SNR).

Figures 7A, 7B:
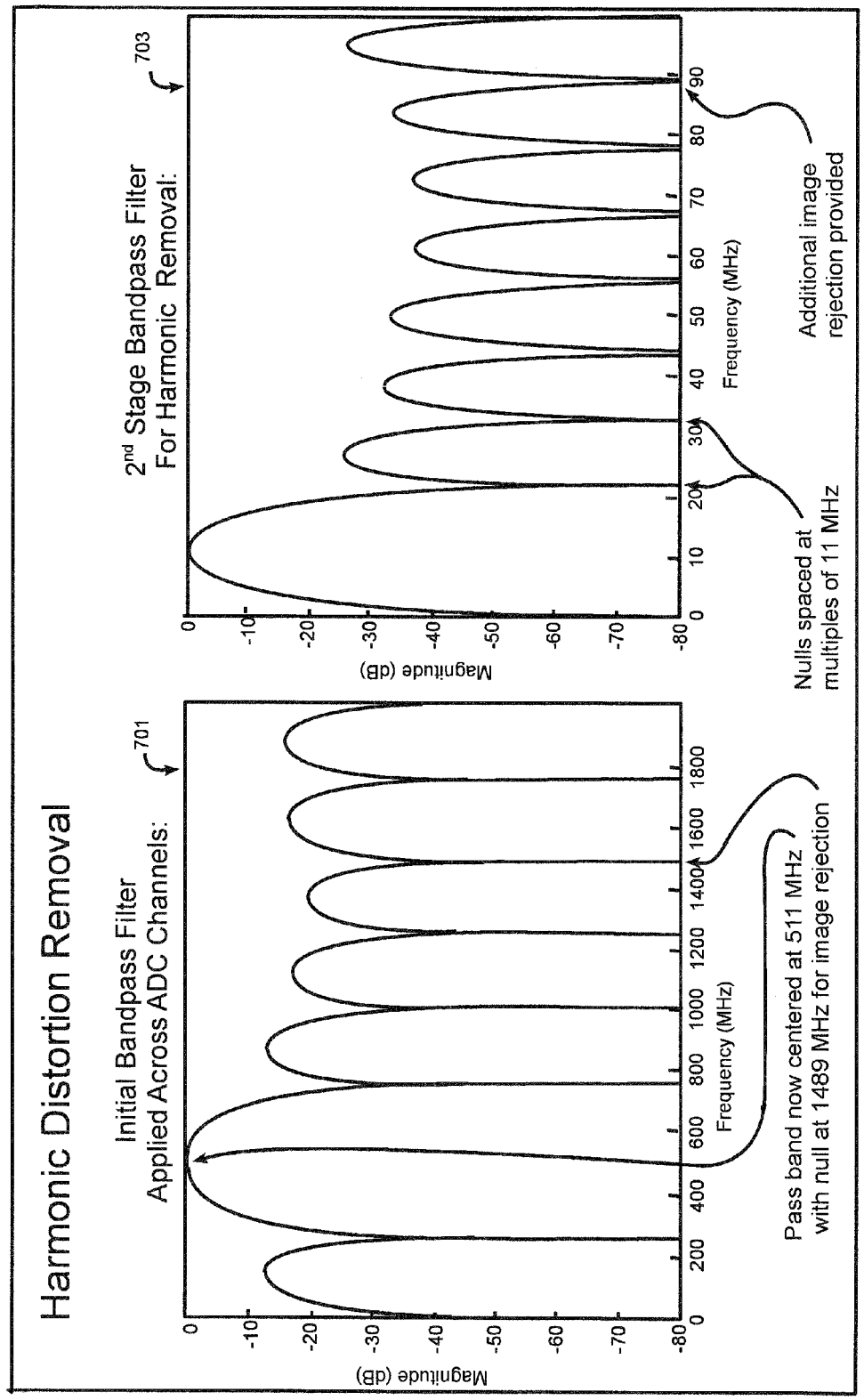
FIG. 7A is a graphical illustration of a the initial bandpass filter response applied across ADC channels according to an embodiment of the invention.
FIG. 7B is a graphical illustration of the frequency response of the second stage complex bandpass filter for harmonics removal according to an embodiment of the invention.

FIG. 7A is a graphical illustration of a the initial bandpass filter response applied across ADC channels. A baseline complex bandpass filter is used to down sample the RF input signal to an intermediate frequency. In the example shown in FIG. 7A, an input test signal at 511 MHz is down sampled to an intermediate frequency centered at about 11 MHz 701.

FIG. 7B is a graphical illustration of the frequency response of the second stage complex bandpass filter for harmonics. The ADCs will produce harmonics at frequencies that are multiples of the 11 MHz intermediate frequency resulting from the baseline complex bandpass filter response shown in FIG. 7A. The fact that harmonics will appear at predetermined frequencies may be exploited to remediate the detrimental effects of the harmonics. For example, harmonics reduce the SFDR of the filter and reduce the signal to noise ratio (SNR) as well as reducing image rejection. A second stage complex bandpass filter is applied having nulls spaced at multiples of 11 MHz to attenuate the harmonics 703. The second stage complex bandpass filter then down samples the complex I and Q outputs to baseband. The resulting second stage complex bandpass filter response increases SFDR, SNR and image suppression of the CADC system by removing the harmful effects of harmonics introduced by the ADC hardware.

Figure 8:
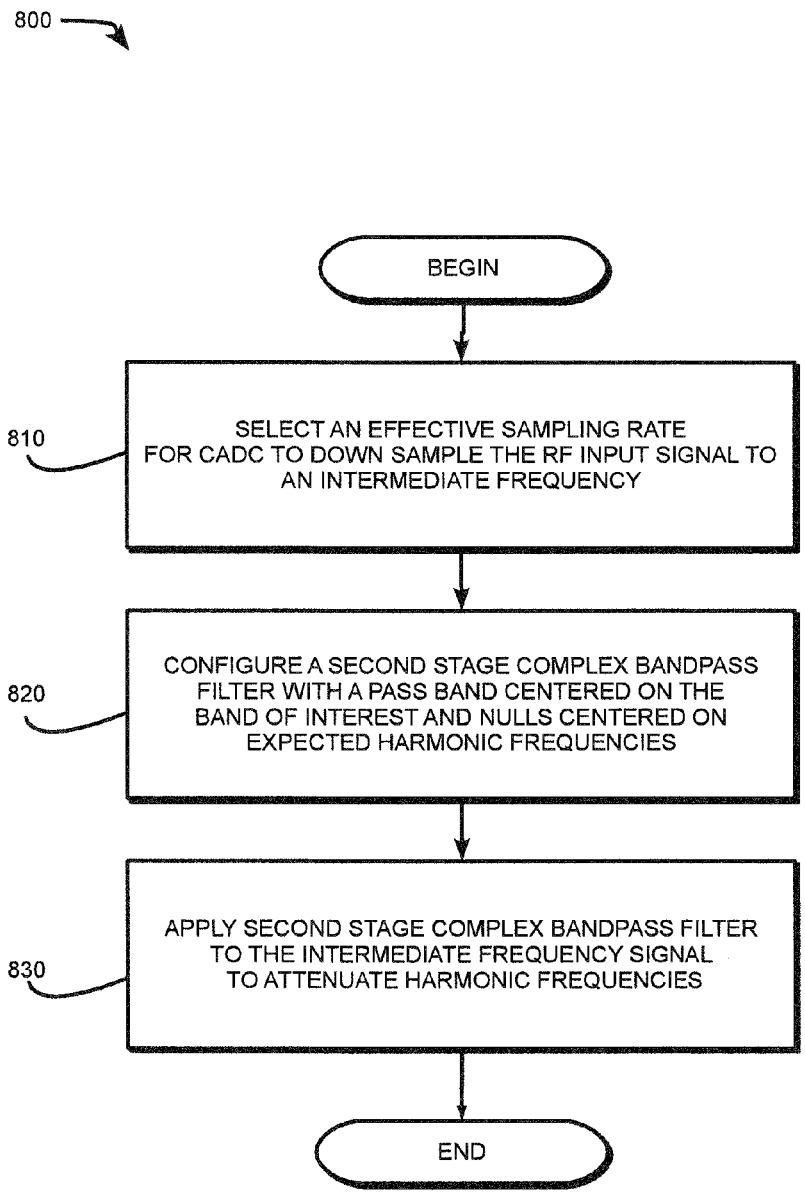
FIG. 8 is a flow diagram of a process of harmonics removal in a CADC.

FIG. 8 is a flow diagram illustrating a harmonics removal process 800 in a CADC according to an embodiment of the invention. The CADC system is configured to have an effective sampling rate that down samples the RF input signal to an intermediate frequency at block 810. The intermediate frequency band is selected such that the lowest intermediate frequency is greater than the bandwidth of the signal of interest. This causes the low order harmonics to fall outside of the band of interest. A second phase complex bandpass filter is configured to have a pass band centered at the band of interest and having nulls centered at expected harmonic frequencies at block 820. The second stage complex bandpass filter is applied to the intermediate frequency signal to attenuate the harmonics created by the ADCs at block 830.

The phase and amplitude corrective processes described herein enable the CADC to operate at expected performance levels despite the use of imperfect hardware. It alleviates the need for overly stringent and expensive manufacturing processes which would otherwise be required to establish the needed balance across the ADC channels. These corrective factors also compensate for changes in the CADC system hardware over time, temperature and operating environment. The IF frequency process and second stage complex bandpass filter attenuate the harmonic distortion that is inevitably introduced by the ADC hardware. This harmonics remediation has the additional benefits of increased SNR and image suppression performance.

The various components and functionality of a corrective direct RF CADC may be implemented in hardware, software or both in any combination. Software implementations may be embodied in a non-transitory machine-readable medium on which software instructions may be stored. The instructions, when executed by a processor, cause the processor to perform the functions of a corrective direct RF CADC. The machine-readable medium may be coupled to a processor through a data bus which allows the instructions and data needed to process the instructions to be input to and output from the processor. The software may be implemented and stored in memory, for example, an internal memory in an FPGA may store software instructions as part of a hardware implementation of the direct RF CADC. Other variants or substitutions may be contemplated by a person skilled in the art without departing from the intended scope of this application.

The embodiments described herein are provided by way of example only to provide a better understanding of the subject matter. Other configurations, calculations, or substitution of elements with equivalent functionality may be contemplated by a person of skill in the art. Such configurations, calculations and substitutions are covered by the scope of this application.

What is claimed is:

1. A complex analog to digital converter (CADC) with corrective factors for amplitude and phase correction comprising:
   a plurality of time skewed analog to digital converters (ADC) configured to sample an input analog signal at an effective sampling rate, each of the plurality of ADCs corresponding to an ADC channel;
   an analyzer circuit configured to receive a plurality of digital samples from each ADC channel and determine an amplitude offset factor and a phase offset factor for each ADC channel;
   a filter coefficient calculator configured to adjust a bandpass filter coefficient corresponding to an ADC channel by applying the amplitude offset factor and the phase offset factor for the ADC channel to an existing filter coefficient for the ADC channel;
   a bandpass filter configured to receive the adjusted filter coefficients and filter the digital samples output by each of the ADC channels using the adjusted filter coefficients.

2. The CADC of claim 1, wherein the analyzer circuit further comprises an amplitude offset calculator and a phase offset calculator.

3. The CADC of claim 2, wherein the amplitude offset factor calculator is configured to determine an amplitude offset factor using digital sample data from each of the plurality of ADC channels, determine a maximum amplitude sample for each ADC channel, assign a first ADC channel as a reference ADC channel, divide the maximum amplitude digital sample value of each other ADC channel by the maximum amplitude digital sample value of the reference ADC channel, and assign the resulting quotient as an amplitude offset factor for a corresponding ADC channel.

4. The CADC of claim 2, wherein the phase offset factor calculator is configured to determine a phase offset factor using digital sample data from each of the plurality of ADC channels based on a known calibration signal applied to the ADC channels, performing a Fourier transform to isolate a known frequency of the known calibration signal, measure a phase for data at the known frequency for each ADC channel, and calculate a phase offset factor as a difference between the measured phase difference and an expected phase difference based on the known frequency.

5. The CADC of claim 1, wherein the filter coefficient calculator is configured to determine bandpass filter coefficients corresponding to at least one of the ADC channels by multiplying the existing bandpass filter coefficient by the amplitude offset factor and an exponential factor containing the phase offset factor corresponding to a given ADC channel.

6. The CADC of claim 1, wherein the complex bandpass filter is configured to shift the input analog signal to baseband.

7. The CADC of claim 1, further comprising:
a first complex bandpass filter configured to shift the frequency of the digital samples of each ADC channel to produce an intermediate frequency bandwidth; and
a second complex bandpass filter configured to filter the intermediate frequency bandwidth to baseband and filter out harmonics created by the ADC associated with the corresponding ADC channel.

8. The CADC of claim 7, wherein the first complex bandpass filter is configured to shift the frequency of the digital samples to an intermediate frequency band, wherein the lowest intermediate frequency is greater than a bandwidth of interest for the received signal.

9. The CADC of claim 1, wherein the time skewed ADCs are configured to sample the analog input signal at an effective sampling rate that is an integer multiple of a frequency of the input signal.

10. The CADC of claim 9, wherein the effective sampling rate is 4 times the frequency of the input signal.

11. The CADC of claim 10, wherein a filter coefficient calculator is provided for every other ADC channel.

12. A method for applying corrective factors to a complex analog to digital converter (CADC) comprising the steps of:
time skewing a plurality of analog to digital converters (ADCs), each ADC associated with an ADC channel;
applying an analog input signal and a calibration signal of a known frequency to the plurality of ADCs;
receiving a plurality of digital samples from each ADC channel;
calculating an amplitude offset factor based on the received digital samples from each ADC channel;
calculating a phase offset factor based on the received digital samples from each ADC channel wherein the received digital samples include samples from the analog input signal and the calibration signal;
applying the amplitude offset factor and the phase offset factor for an associated ADC channel to a complex bandpass filter coefficient corresponding to the ADC channel to produce an adjusted bandpass filter coefficient;
filtering the digital samples of the analog input signal in a complex bandpass filter using the adjusted bandpass filter coefficients for each ADC channel to produce a complex corrected output.

13. The method of claim 12, further comprising:
computing an amplitude offset factor by receiving a plurality of digital samples from each of the plurality of ADC channels;
determining a maximum amplitude sample for each ADC channel;
assigning a first ADC channel as a reference ADC channel;
dividing the maximum amplitude digital sample value of each other ADC channel by the maximum amplitude digital sample value of the reference ADC channel; and
assigning the resulting quotient as an amplitude offset factor for a corresponding ADC channel.

14. The method of claim 12, further comprising:
computing a phase offset factor by receiving a plurality of digital samples from each of the plurality of ADC channels based on a known calibration signal applied to the ADC channels;
performing a Fourier transform to isolate a known frequency of the known calibration signal;
measuring a phase for data at the known frequency for each ADC channel; and
determining a phase offset factor as a difference between the measured phase difference and an expected phase difference based on the known frequency.

15. The method of claim 12, further comprising:
determining an adjusted bandpass filter coefficient corresponding to one of the ADC channels by multiplying an existing bandpass filter coefficient by the amplitude offset factor and an exponential factor containing the phase offset factor corresponding to the ADC channel.

16. The method of claim 12, further comprising:
filtering the digital samples of the analog input signal in a first complex bandpass filter to shift a frequency of the input signal to a intermediate frequency bandwidth; and
filtering the digital samples of the input signal at the intermediate frequency bandwidth in a second complex bandpass filter to baseband, wherein the second complex bandpass filter filters out harmonics generated by the ADC associated with the ADC channel being filtered.

17. The method of claim 16, wherein the intermediate frequency bandwidth has a lowest intermediate frequency that is greater than the bandwidth of interest of the received signal.

18. The method of claim 12, further comprising applying a time skewed clock signal to a plurality of ADCs to provide an effective sample rate that is an integer multiple of the input signal.

19. The method of claim 18, wherein the effective sampling rate is about 4 times the frequency of the input signal.

20. The method of claim 19, wherein the steps of computing a phase offset, amplitude offset, and applying the offset factors to a complex bandpass filter coefficient are performed for every other ADC channel.

21. A non-transitory machine-readable medium having processor-executable instructions stored thereon, which instructions when executed by a processor, cause the processor to:
receive a plurality of digital samples of an analog input signal from a plurality of time skewed analog to digital converters (ADCs) at an effective sampling rate, each ADC corresponding to an ADC channel;
calculate an amplitude offset factor for each ADC channel based on the associated received digital samples;
calculate a phase offset factor for each ADC channel based on the associated received digital samples;
apply the amplitude offset factor and the phase offset factor for an ADC channel to a complex bandpass filter coefficient corresponding to the ADC channel to produce an adjusted filter coefficient;
filter the plurality of digital samples in a complex bandpass filter, using the adjusted filter coefficients for each ADC channel.

22. The non-transitory computer readable medium of claim 21, wherein the instructions, when executed by a processor, further cause the processor to:

compute an amplitude offset factor by receiving a plurality of digital samples from each of the plurality of ADC channels;

determine a maximum amplitude sample for each ADC channel;

assign a first ADC channel as a reference ADC channel;

divide the maximum amplitude digital sample value of each other ADC channel by the maximum amplitude digital sample value of the reference ADC channel; and assign the resulting quotient as an amplitude offset factor for a corresponding ADC channel.

23. The non-transitory computer readable medium of claim 21, wherein the instructions, when executed by a processor, further cause the processor to:

compute a phase offset factor by receiving a plurality of digital samples from each of the plurality of ADC channels based on a known calibration signal applied to the ADC channels;

perform a Fourier transform to isolate a known frequency of the known calibration signal;

measure a phase for data at the known frequency for each ADC channel; and calculate a phase offset factor as a difference between the measured phase difference and an expected phase difference based on the known frequency.

24. The non-transitory computer readable medium of claim 21 wherein the instructions, when executed by a processor, further cause the processor to:

calculate an adjusted bandpass filter coefficient corresponding to one of the ADC channels by multiplying an existing bandpass filter coefficient times the amplitude offset factor and an exponential factor containing the phase offset factor corresponding to the ADC channel.

25. The non-transitory computer readable medium of claim 21, wherein the instructions, when executed by a processor, further cause the processor to:

filter the digital samples of the analog input signal in a first complex bandpass filter to shift a frequency of the input signal to a intermediate frequency bandwidth; and filter the digital samples of the input signal at the intermediate frequency bandwidth in a second complex bandpass filter to baseband, wherein the second complex bandpass filter filters out harmonics generated by the ADC associated with the ADC channel being filtered.

26. The non-transitory computer readable medium of claim 21, wherein the intermediate frequency bandwidth has a lowest intermediate frequency that is greater than the bandwidth of interest of the received signal.

27. The non-transitory computer readable medium of claim 21, wherein the instructions, when executed by a processor, further cause the processor to:

apply a time skewed clock signal to a plurality of ADCs to provide an effective sample rate that is an integer multiple of the input signal.

28. The non-transitory computer readable medium of claim 27, wherein the effective sampling rate is a 4 times the frequency of the input signal.

29. The non-transitory computer readable medium of claim 28, wherein the calculating an amplitude offset factor, calculating a phase offset factor, and applying the offset factors to a complex bandpass filter coefficient are performed for every other ADC channel.

* * * * *